(12) United States Patent
Chen et al.

(10) Patent No.: US 9,496,325 B2
(45) Date of Patent: Nov. 15, 2016

(54) SUBSTRATE RESISTOR AND METHOD OF MAKING SAME

(75) Inventors: Hua Feng Chen, Hsin-Chu (TW); Shu-Hui Wang, Hsin-Chu (TW); Mu-Chi Chiang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 994 days.

(21) Appl. No.: 13/533,543

(22) Filed: Jun. 26, 2012

(65) Prior Publication Data

US 2013/0341731 A1    Dec. 26, 2013

(51) Int. Cl.
| | |
|---|---|
| *H01L 27/11* | (2006.01) |
| *H01L 49/02* | (2006.01) |
| *H01L 27/06* | (2006.01) |
| *H01L 27/08* | (2006.01) |

(52) U.S. Cl.
CPC .......... *H01L 28/20* (2013.01); *H01L 27/0629* (2013.01); *H01L 27/0802* (2013.01); *H01L 2924/0002* (2013.01)

(58) Field of Classification Search
CPC .... H01L 27/02; H01L 27/06; H01L 27/1112; H01L 27/0629; H01L 27/11; H01L 27/0688; H01L 27/0802; H01L 21/823842; H01L 21/02; H01L 28/24; H01L 27/20
USPC ......... 257/379, 380, 536, E21.004, E27.016; 438/382
See application file for complete search history.

(56) References Cited

U.S. PATENT DOCUMENTS

| | | | |
|---|---|---|---|
| 5,120,572 A | 6/1992 | Kumar | |
| 6,611,039 B2 | 8/2003 | Anthony | |
| 8,890,260 B2 | 11/2014 | Chuang et al. | |
| 2004/0070033 A1* | 4/2004 | Shin | H01L 27/0629 257/379 |
| 2010/0197106 A1 | 8/2010 | Ryou et al. | |
| 2010/0308436 A1 | 12/2010 | Nanjo | |
| 2011/0057267 A1* | 3/2011 | Chuang | H01L 21/823842 257/380 |
| 2013/0105912 A1* | 5/2013 | Hsu | H01L 27/0629 257/379 |
| 2013/0168816 A1* | 7/2013 | Kang | H01L 28/24 257/536 |

FOREIGN PATENT DOCUMENTS

| | | |
|---|---|---|
| CN | 1409396 A | 4/2003 |
| CN | 102013424 A | 4/2011 |
| JP | 2010153736 A | 7/2010 |
| JP | 2010283310 A | 12/2010 |
| KR | 20100089781 A | 8/2010 |

* cited by examiner

*Primary Examiner* — Kenneth Parker
*Assistant Examiner* — Young W Kim
(74) *Attorney, Agent, or Firm* — Slater Matsil, LLP

(57) ABSTRACT

A semiconductor structure includes a resistor on a substrate formed substantially simultaneously with other device elements, such as one or more transistors. A diffusion barrier layer deposited on a substrate is patterned to form a resistor and barrier layers under a transistor gate. A filler material, a first connector, and a second connector are formed on the resistor in a substantially similar manner as that used to form the gate of the transistor. The filler material is removed.

20 Claims, 8 Drawing Sheets

SUBSTRATE RESISTOR AND METHOD OF MAKING SAME

BACKGROUND

Generally, a resistor is a passive electrical component that limits the flow of electrical current. A resistor may be constructed of various compounds and films with two or more wire leads to allow connection to a circuit. The ratio of the voltage applied across the resistor to the current flow through the resistor is called resistance. Resistance is measured in Ohm's.

Traditionally, the resistance of a resistor may be increased by increasing the size of the resistor itself. This increase in size of the resistor is opposed to the miniaturization of semiconductor dies. Therefore, the size of resistors of resistors has steadily decreased. However, the processing steps to manufacture miniaturized resistors may lead to a variation in the resistance.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
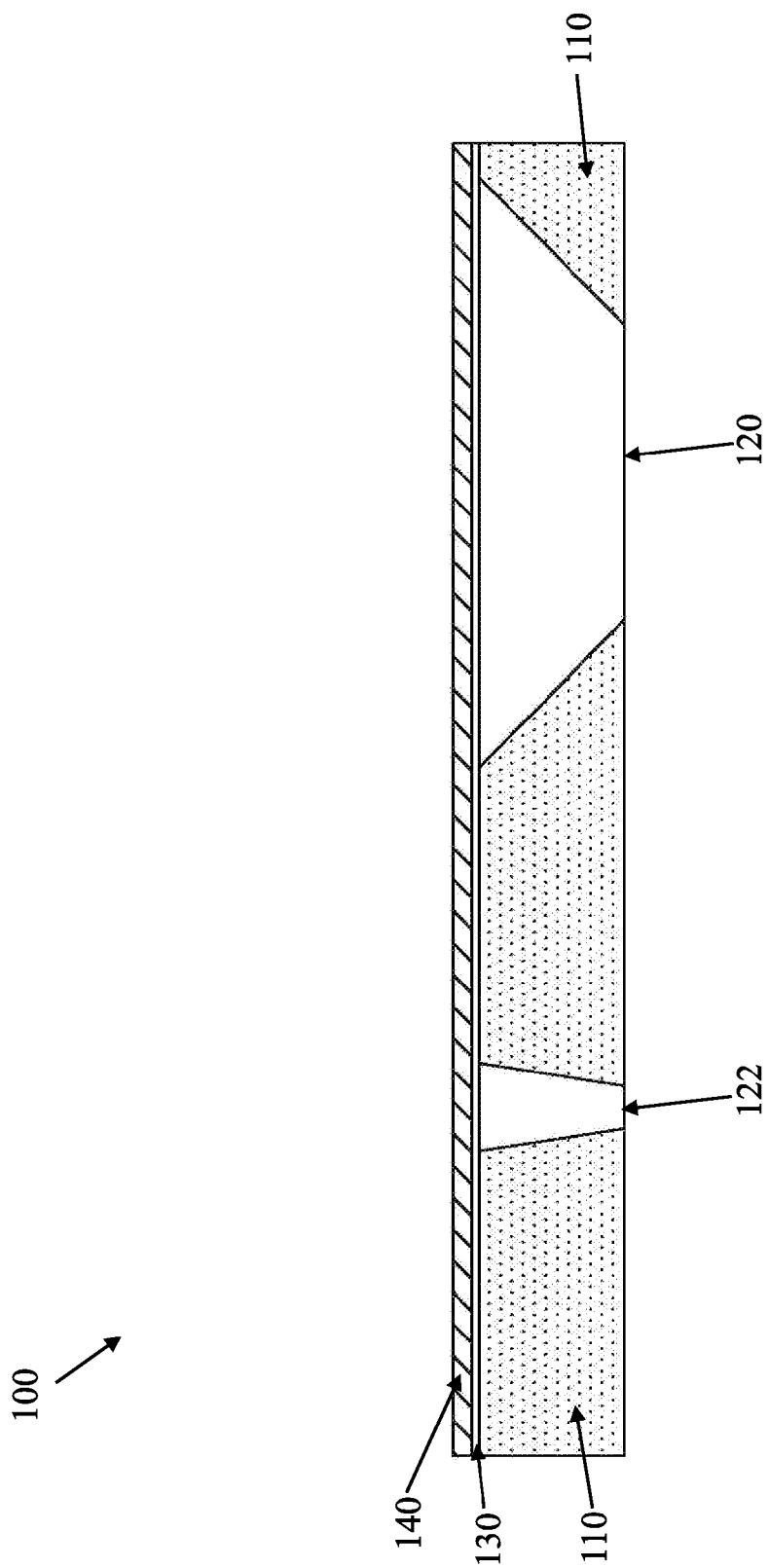
FIGS. 1 through 7 illustrate in cross-sectional views the steps in the manufacture of a semiconductor device structure in accordance with an embodiment.

Various steps in the formation of a semiconductor device structure will be described with reference to FIGS. 1 through 7. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

With reference now to FIG. 1, there is shown a portion of a semiconductor die 100 including a substrate 110, a first isolation region 120, a second isolation region 122, a gate dielectric layer 130, and a diffusion barrier layer 140. The substrate 110 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The substrate 110 may include active devices (not shown in FIG. 1 for clarity). As one of ordinary skill in the art will recognize, a wide variety of active devices such as transistors, capacitors, resistors, combinations of these, and the like may be used to generate the structural and functional requirements of the design for the semiconductor die 100. The active devices may be formed using any suitable methods.

The substrate 110 may also include metallization layers (also not shown in FIG. 1 for clarity). The metallization layers may be formed over the active devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.).

The first isolation region 120 and the second isolation region 122 may be shallow trench isolation (STI) regions, and may be formed by etching the substrate 110 to form a trench and filling the trench with a dielectric material. In accordance with an embodiment, the isolation regions may be filled with a dielectric material such as an oxide material, a high-density plasma (HDP) oxide or the like.

Prior to the intermediate stage shown in FIG. 1, the substrate 110 received a gate dielectric layer 130 formed over the substrate using, for example, atomic layer deposition (ALD), physical vapor deposition (PVD), chemical vapor deposition (CVD) or other acceptable methods for gate dielectric deposition. In an embodiment, a high-k gate dielectric layer may be deposited. A high-k dielectric has a dielectric constant, k, greater than that of silicon dioxide (oxide) dielectric, or greater than about 3.9. The material used can be any high-k gate dielectric; in one example, a hafnium based material is used, such as hafnium oxide. Other high-k gate dielectrics may include silicon nitrides, oxynitrides, metal oxides such as $HfO_2$, $HfZrO_x$, $HfSiO_x$, $HfTiO_x$, $HfAlO_x$, and the like, and combinations and multilayers thereof.

The diffusion barrier layer 140 may be formed over the gate dielectric layer 130. The diffusion barrier layer 140 may help to prevent the diffusion of dopants from a doped polysilicon gate (see first gate structure 270 from FIG. 3) through the gate dielectric layer 130 into the substrate 110, which may cause processing problems and affect the performance of the device The diffusion barrier layer 140 may be deposited using, for example, ALD, PVD, CVD, or other acceptable methods for diffusion barrier layer deposition. The diffusion barrier layer may be formed of titanium, titanium nitride, tantalum, tantalum nitride, or combinations thereof. In an embodiment, the diffusion barrier layer 140 may have a thickness between about 5 angstroms and about 100 angstroms.

Figure 2:
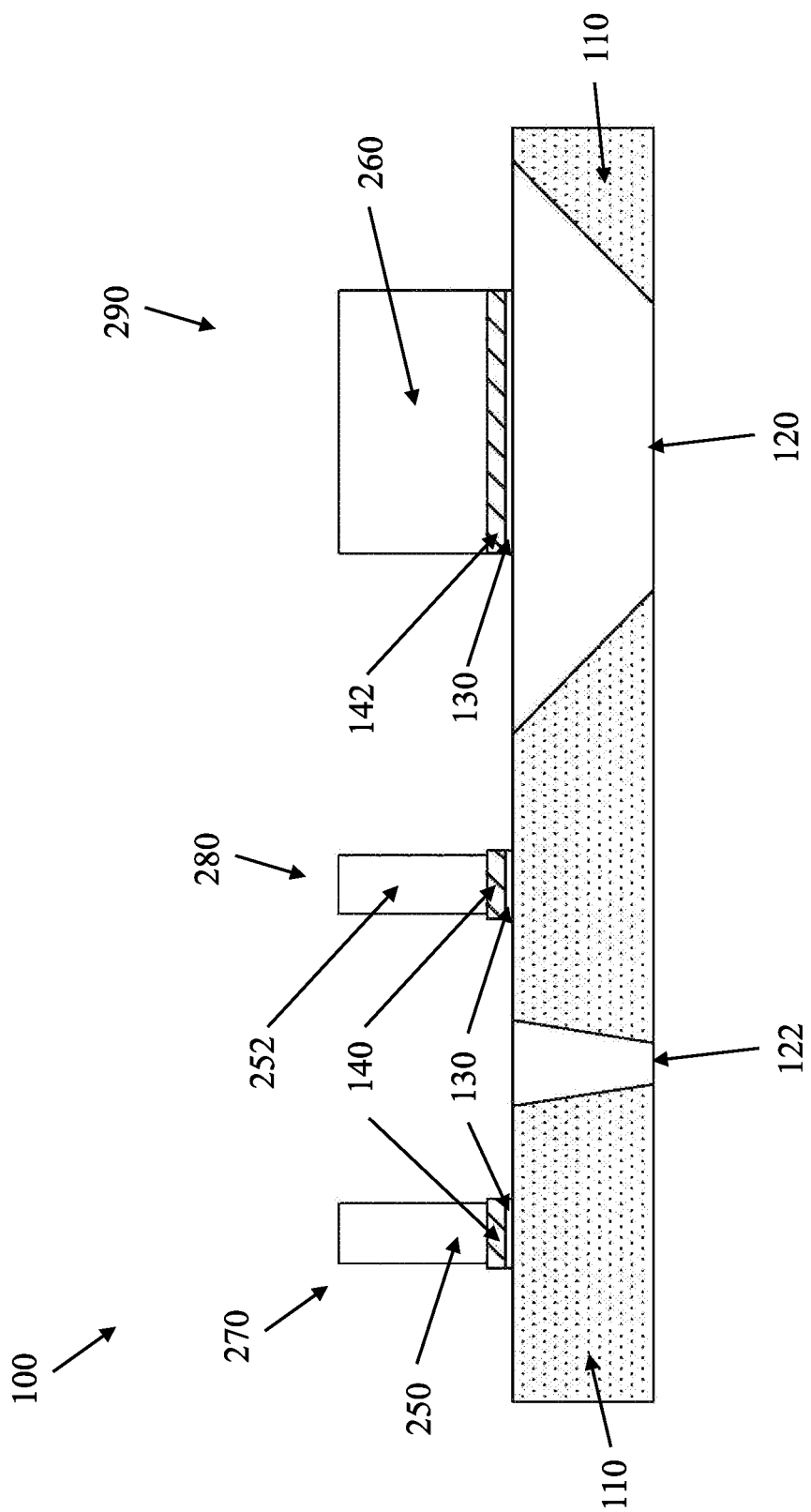

FIG. 2 depicts semiconductor die 100 of FIG. 1 in a cross-sectional view following additional processing steps to form a first gate structure 270, a second gate structure 280, and a resistor structure 290. The first step in the transition from the intermediate process state of FIG. 1 to the cross-section of FIG. 2 is the deposition of a polysilicon layer (not shown) followed by the deposition of a hard mask layer (not shown). Both layers may be deposited with ALD, PVD, CVD, or other acceptable methods. The polysilicon layer may be formed from an elemental semiconductor such as silicon, an alloy semiconductor such as silicon-germanium, or a compound semiconductor such as gallium arsenide or indium phosphide. In an embodiment, the polysilicon layer is silicon. The polysilicon layer may then doped through an implantation process to introduce p-type or n-type impurities into the polysilicon layer.

The hard mask layer (not shown) is a protective layer to prevent the underlying structures, such as the polysilicon layer, from being removed during an etching process. In an embodiment, the hard mask layer may comprise a single silicon nitride layer. In another embodiment, the hard mask layer comprises an oxide layer, such as a silicon oxide layer, and an overlying nitride layer, such as a silicon nitride ($Si_3N_4$) layer. The oxide layer may be formed by any oxidation process, such as wet or dry thermal oxidation in an ambient environment comprising an oxide, $H_2O$, NO, or a combination thereof, or by CVD techniques. One of ordinary skill in the art will appreciate that other mask materials and/or structures may be used to form hard mask layer. For example, other materials, a single layer, three or more layers, or the like may be used.

After the deposition of the hard mask layer (not shown), the hard mask layer is then patterned and the polysilicon layer, the diffusion barrier layer 140, and the gate dielectric layer 130 are etched in accordance with the pattern. In this manner, a first polysilicon section 250 of the first gate structure 270 and a second polysilicon section 252 of the second gate structure 280 are formed on the substrate 110 while the filler section 260 of the resistor structure 290 is formed on the first isolation region 120. The first polysilicon section 250 is a part of a gate structure for a transistor while the second polysilicon section 252 and the filler section 260 will be removed in subsequent processing. The patterning of the diffusion barrier layer 140 has formed three separate sections of the diffusion barrier layer 140. Two of the sections may be used in gate structures for transistors, and a third section, a resistor material 142 section, may be used as a substrate resistor.

In an alternative embodiment, the first polysilicon section 250 of the first gate structure 270, the second polysilicon section 252 of the second gate structure 280, and the filler section 260 of the resistor structure 290 may be epitaxially grown from a top surface of the diffusion barrier layer 140 within trenches or openings formed in a patterned layer atop diffusion barrier layer 140. After the sections are grown, the diffusion barrier layer 140 and the gate dielectric layer 130 may be patterned and etched as discussed above. Because the process is known in the art, the details are not repeated herein.

As one of ordinary skill in the art will recognize, the filler section 260 may comprise other materials used during the formation of semiconductor die 100. For example, in an embodiment, the filler section 260 may comprise a metal as discussed in the next step. In another embodiment, the filler section 260 may be a dielectric material as discussed in reference to FIG. 4 and the first interlayer dielectric 420. In yet another embodiment, the filler section 260 may comprise a spacer material as discussed in reference to FIG. 3 and spacers 310. Thus, the material used for the filler section 260 is not limited to polysilicon because the filler section 260 will be removed in subsequent step to enable the resistor material 142 to have a higher and more controllable resistance value.

Figure 3:
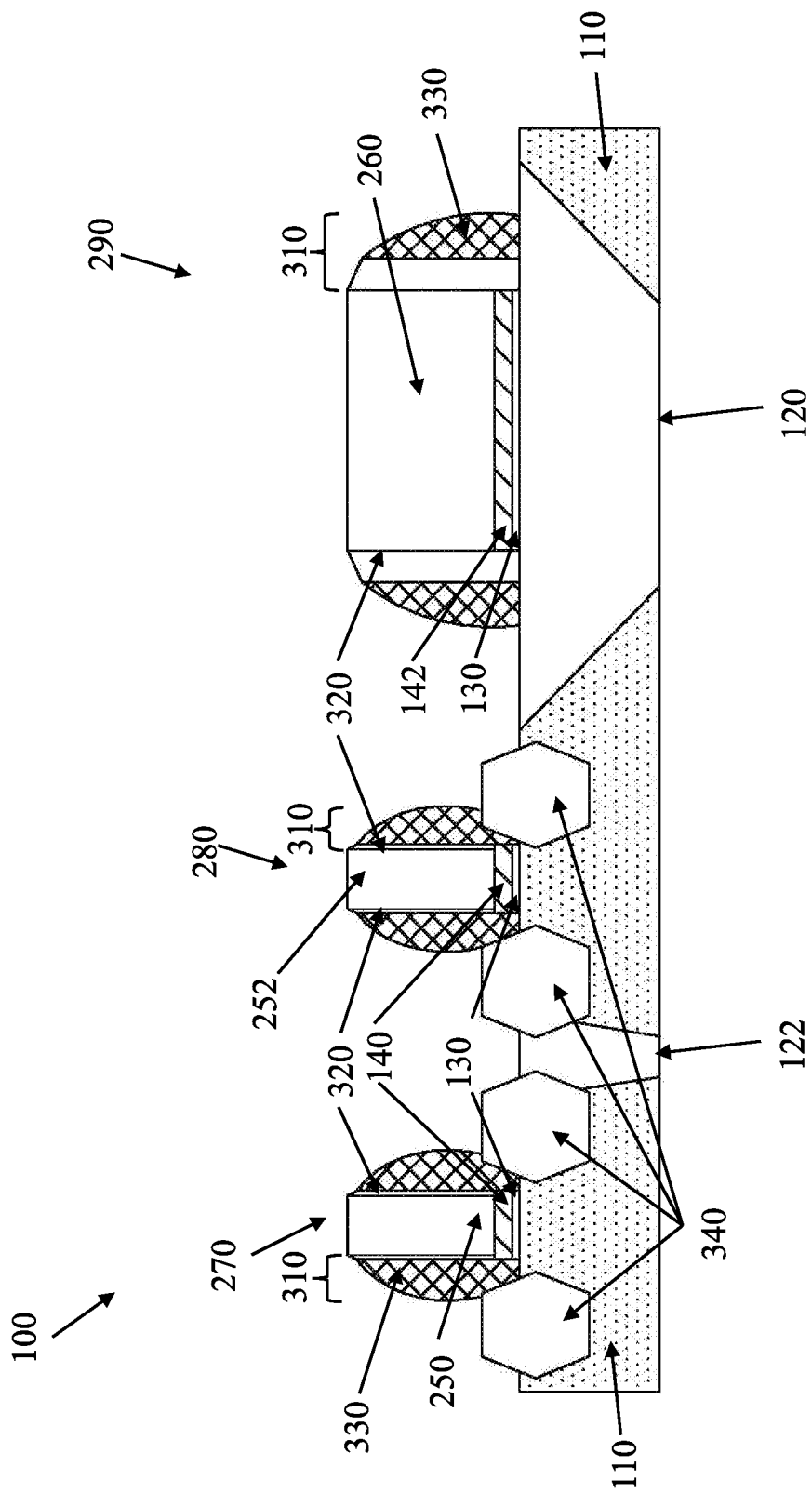

With reference to FIG. 3, spacers 310 are formed on the first gate structure 270, the second gate structure 280, and the resistor structure 290. The spacers comprise a first spacer layer 320 and a second spacer layer 330 and are formed by blanket depositing the two spacer layers (not shown) on the previously formed structure. The spacer layers may comprise SiN, oxynitride, SiC, SiON, oxide, and the like and may be formed by ALD, PVD, CVD, or other acceptable methods. The spacers 310 are then patterned to remove the spacer layer from the horizontal surfaces of the structure, for example by an anisotropic etching process. In an embodiment, the first spacer layer 320 comprises SiON and the second spacer layer 330 comprises SiN. In another embodiment, the spacers 310 are formed of a single spacer layer formed in a manner similar to the above-described spacer layers and of like materials.

Following the formation of the spacers 310, the source/drain regions 340 are formed. In an embodiment, the source/drain regions 340 may be fabricated by forming recesses (not shown) in substrate 110 and epitaxially growing material in the recesses. In an embodiment, the recesses may be formed by an anisotropic etch. Alternatively, the recesses may be formed by an isotropic orientation-dependent etching process, wherein tetramethylammonium hydroxide (TMAH) or the like may be used as an etchant. After the recesses are formed, the source/drain regions 340 may be formed by epitaxially growing material in the recesses. During the epitaxy process, etching gas, such as HCl gas, may be added (as an etching gas) into the process gas, so that the source/drain regions 340 are selectively grown in the recesses, but not on the gate structures or the resistor structure. In alternative embodiments, no etching gas is added, or the amount of etching gas is small, so that there is a thin layer of the source/drain regions 340 formed on the gate structures and the resistor structure. In yet another embodiment, the first gate structure 270, the second gate structure 280, and the resistor structure 290 may be covered with a sacrificial layer (not shown) to prevent epitaxial growth thereon. The source/drain regions 340 may be doped either through an implantation method as discussed above, or by in-situ doping as the material of source/drain regions 340 is grown.

Methods of forming source/drain regions 340 may include ALD, CVD, such as a reduced pressure CVD (RPCVD), metalorganic chemical vapor deposition (MOCVD), or other applicable methods. Depending on the desired composition of the source/drain regions 340, the precursors for epitaxial growth may include Si-containing gases and Ge-containing gases, such as $SiH_4$ and $GeH_4$, and/or the like, and the partial pressures of the Si-containing gases and Ge-containing gases may be adjusted to modify the atomic ratio of germanium to silicon.

In another embodiment, source/drain regions 340 are formed so as to impart a strain on the channel region underneath the first gate structure 270 and the second gate structure 280. In an embodiment where substrate 110 comprises silicon, source/drain regions 340 may be formed through a selective epitaxial growth (SEG) process with a material, such as silicon germanium, silicon carbon, or the like, that has a different lattice constant than that of silicon. The lattice mismatch between the stressor material source/drain regions 340 and the channel region formed underneath the first gate structure 270 and the second gate structure 280 will impart a stress in the channel region that will increase carrier mobility and overall performance of the device. The source/drain regions 340 may be doped either through an implantation method as discussed above, or by in-situ doping as the material of the source/drain regions is grown.

Figure 4:
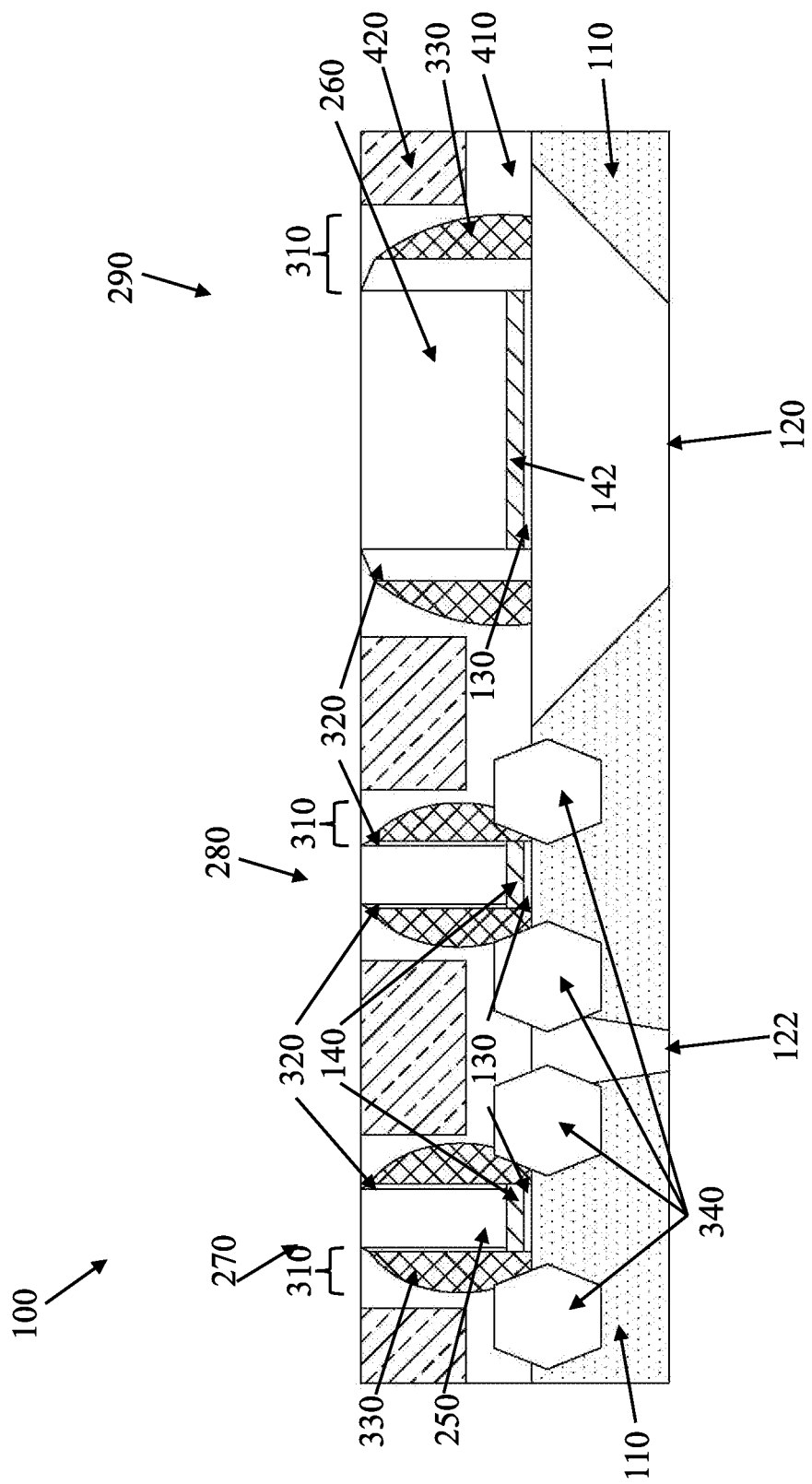

In FIG. 4, a first etch stop layer 410 may be formed over the first gate structure 270, the second gate structure 280, the resistor structure 290, the source/drain regions 340, and the exposed portions of the substrate 110 in order to provide a control point for a subsequent etch process. The first etch stop layer 410 may be a dielectric material such as SiN, SiON or the like. In accordance with an embodiment the first etch stop layer 410 may be formed by ALD, PVD, CVD, or other acceptable methods.

The first interlayer dielectric (ILD) layer 420 may be formed over the first etch stop layer 410. The first ILD layer 420 may be formed by ALD, PVD, CVD, spin-on glass (SOG), or other acceptable methods for forming an ILD. The first ILD layer 420 may comprise doped or undoped silicon oxide, although other materials such as low-k materials, combinations of these, or the like, may alternatively be utilized. After formation of the first ILD layer 420, the first etch stop layer 410, the first ILD layer 420, the first gate structure 270, the second gate structure 280, and the resistor structure 290 may be planarized using suitable techniques such as a chemical mechanical polish (CMP) process.

Figure 5:
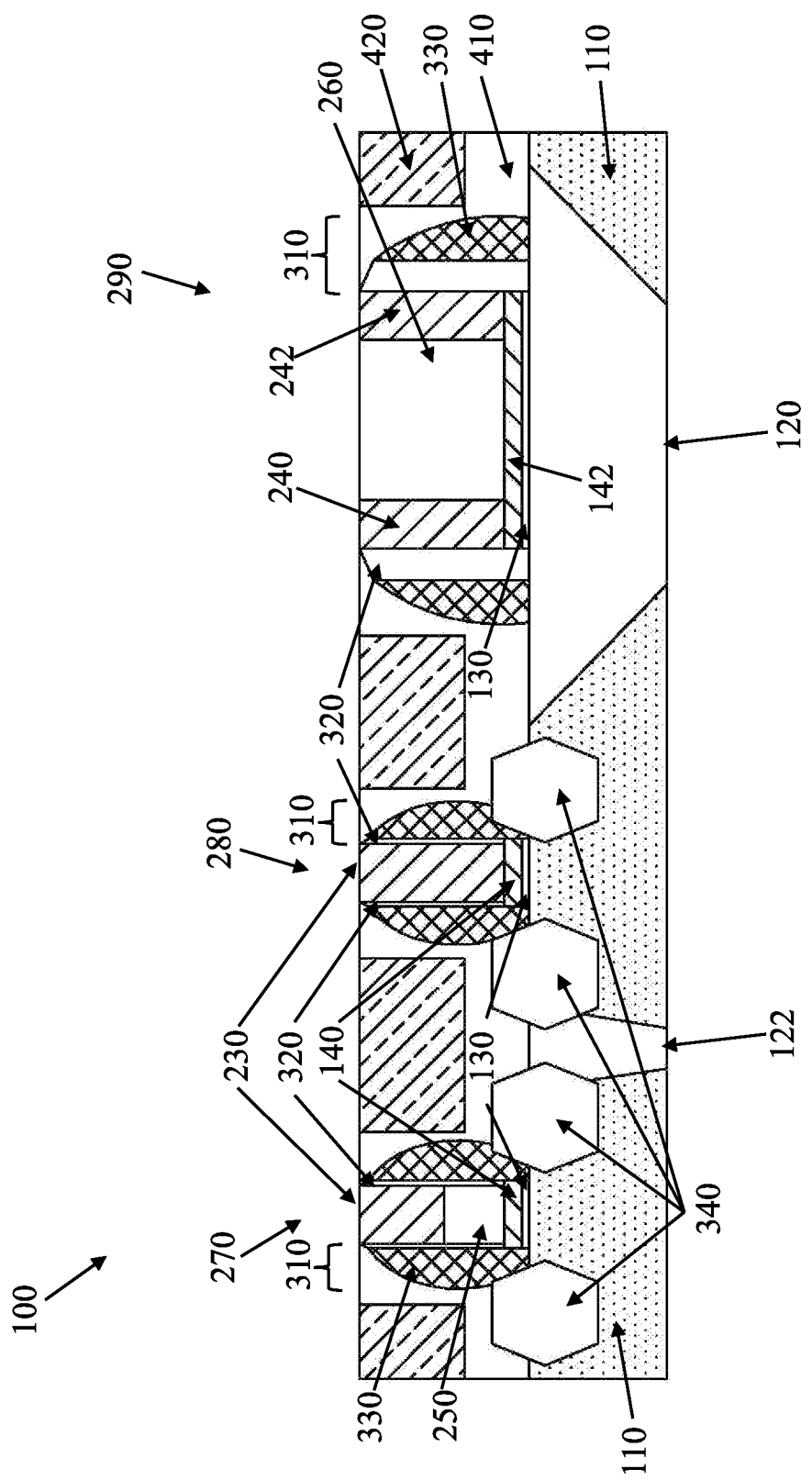

After the first etch stop layer 410 and the first ILD layer 420 are formed, metal sections 230 of the first and second gate structures 270 and 280, and also the first and second resistor connectors 240 and 242 of the resistor structure 290, may be formed as illustrated in FIG. 5. These may be formed by removing portions of the first polysilicon section 250 of the first gate structure 270, the second polysilicon section 252 of the second gate structure 280, and the filler section 260 of the resistor structure 290, and replacing those portions with metal. A metal layer (not shown) may be blanket deposited over the polysilicon sections, the first etch stop layer 410, and the first ILD layer 420. The metal layer may then be patterned to form the metal section 230 of the first and second gate structures 270 and 280, and also the first and second resistor connectors 240 and 242 of the resistor structure 290. The metal layer may comprise metallic nitrides, metallic silicides, metallic oxides, and metals. The first and second resistor connectors 240 and 242 may allow for physical and electrical contact to the resistor material 142 from a component above the resistor structure 290. Examples of metallic nitrides include tungsten nitride, molybdenum nitride, titanium nitride, and tantalum nitride, or combinations thereof. Examples of metallic silicide include tungsten silicide, titanium silicide, cobalt silicide, nickel silicide, platinum silicide, erbium silicide, or combinations thereof. Examples of metallic oxides include ruthenium oxide, indium tin oxide, or combinations thereof. Examples of metal include tungsten, titanium, aluminum, copper, molybdenum, nickel, platinum, or the like.

Figure 6:
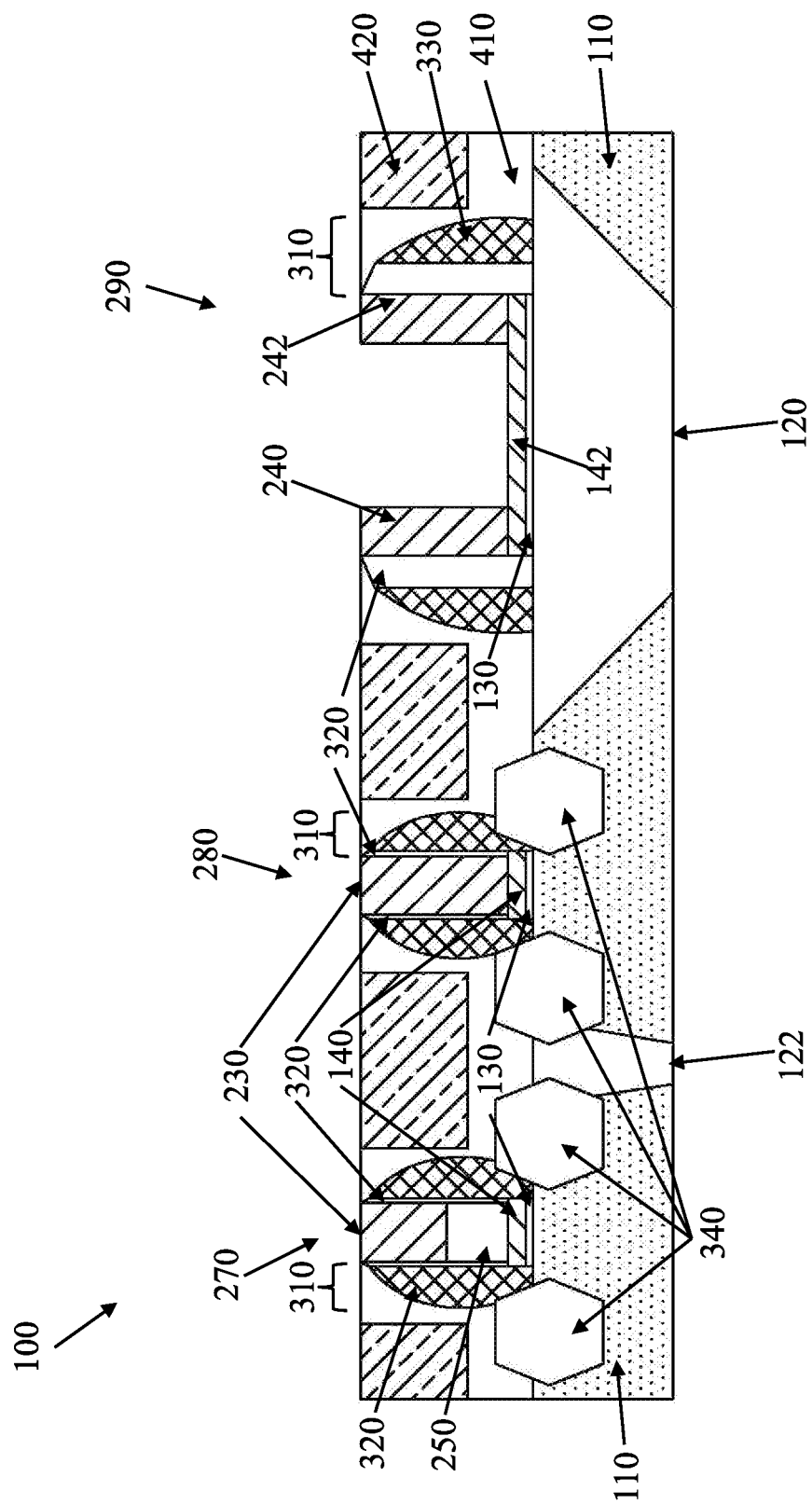

FIG. 6 illustrates the removal of the filler section 260 of the resistor structure 290. The filler section 260 may be removed without removing the resistor material 142 below it or the resistor connectors 240, 242. The removal of the filler section 260 may prevent the filler section 260 from acting as a parallel resistor to the resistor material 142 below it, and, thus lowering the resistance value between first resistor connector 240 and second resistor connector 242. In an embodiment, the filler section 260 may be removed by a self-aligned etch process with an etch chemistry of $Cl_2$, HBr, $NF_3$, and $O_2$.

Figure 7:
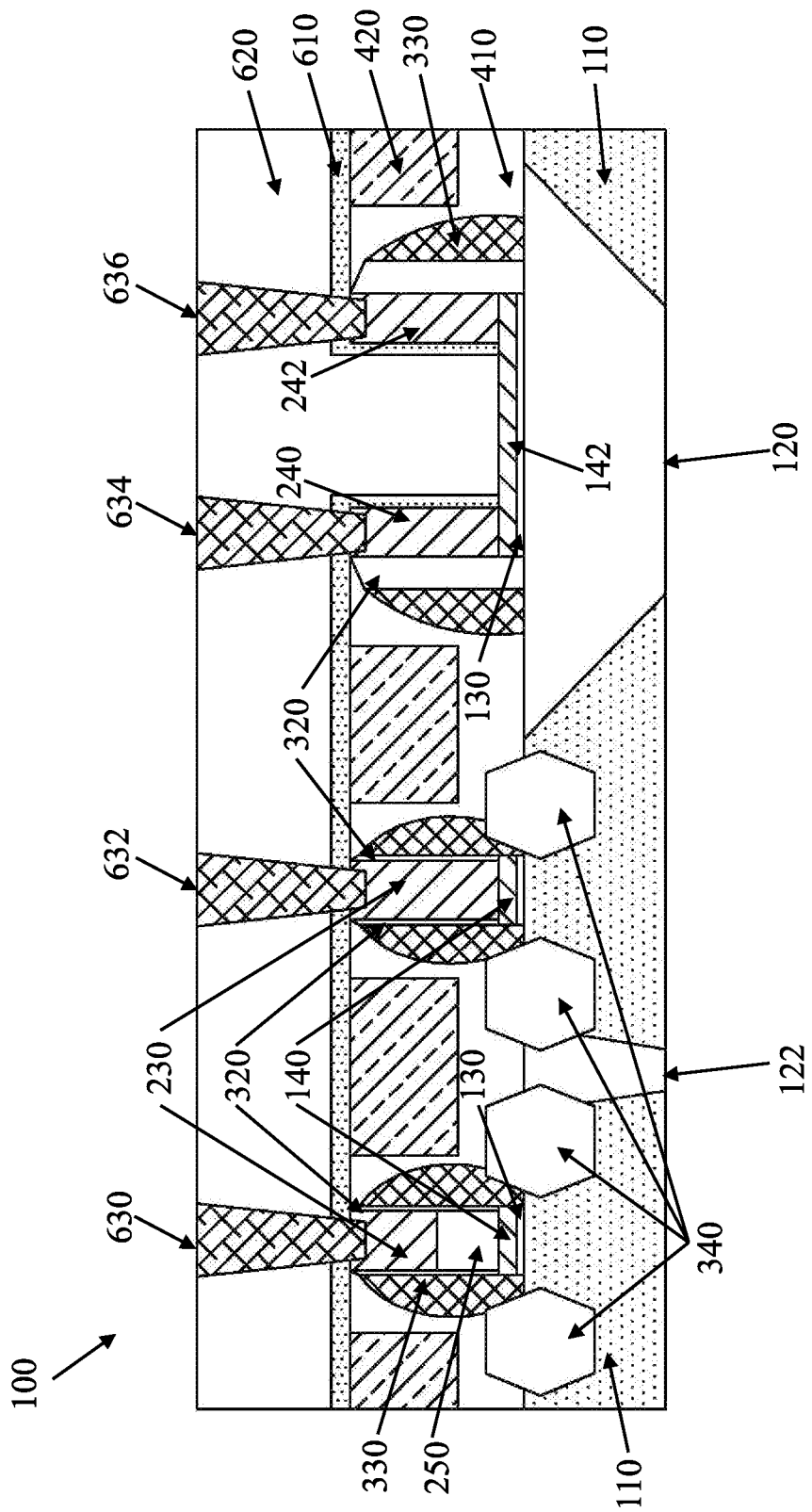

In FIG. 7, a second etch stop layer 610 may be formed over the first etch stop layer 410, the first ILD layer 420, the first gate structure 270, the second gate structure 280, and the resistor structure 290 in order to provide a control point for a subsequent etch process. The second etch stop layer 610 may be a dielectric material such as SiN, SiON or the like. In accordance with an embodiment the second etch stop layer 610 may be formed by ALD, PVD, CVD, or other acceptable methods.

The second interlayer dielectric (ILD) layer 620 may be formed over the second etch stop layer 610. The second ILD layer 620 may be formed by methods and of similar materials as discussed above in reference to the first ILD layer 420. After formation of the second ILD layer 620, the second ILD layer 620 may be planarized using suitable techniques such as a chemical mechanical polish (CMP) process.

After the second ILD layer 620 has been formed and planarized, the first contact 630, the second contact 632, the third contact 634, and the fourth contact 636 may be formed over the first gate structure 270, the second gate structure 280, and the first resistor connector 240, and the second resistor connector 242, respectively, in order to allow for physical and electrical contact to the transistor and resistor structures through the second ILD layer 620.

The first contact 630, the second contact 632, the third contact 634, and the fourth contact 636 may comprise copper, but other materials, such as aluminum or tungsten, may alternatively be used. The first contact 630, the second contact 632, the third contact 634, and the fourth contact 636 may be formed, e.g., by forming openings through the second ILD layer 620 and the second etch stop layer 610 using, e.g., a suitable photolithographic mask and etching process. After the openings have been formed, the first contact 630, the second contact 632, the third contact 634, and the fourth contact 636 may be formed using a seed layer (not shown) and a plating process, such as electrochemical plating, although other processes of formation, such as sputtering, evaporation, or a plasma-enhanced CVD (PECVD) process, may alternatively be used depending upon the materials. Once the openings for the first contact 630, the second contact 632, the third contact 634, and the fourth contact 636 have been filled with conductive material, any excess conductive material outside of the openings may be removed, the first contact 630, the second contact 632, the third contact 634, and the fourth contact 636, and the second ILD layer 620 may be planarized using, for example, a CMP process.

The resistor structure 290 comprises resistor material 142, first resistor connector 240, and second resistor connector 242. The third contact 634 and the fourth contact 636 provide electrical contact to resistor material 142 through first resistor connector 240 and second resistor connector 242. As described above, the materials and processes for forming the resistor structure are similar to the materials and processes used in the formation of a transistor, and, thus do not require any special processes to be performed. The resistance of resistor material 142 may be controlled, e.g., by the thickness of the resistor material layer. For example, in an embodiment, resistor material 142 comprises TiN with a thickness of approximately 2 nm, which has a resistance of approximately 600 Ohms/square. In another embodiment, resistor material 142 comprises TiN with a thickness of approximately 5 nm, which has a resistance of approximately 1500 Ohms/square.

Figure 8:
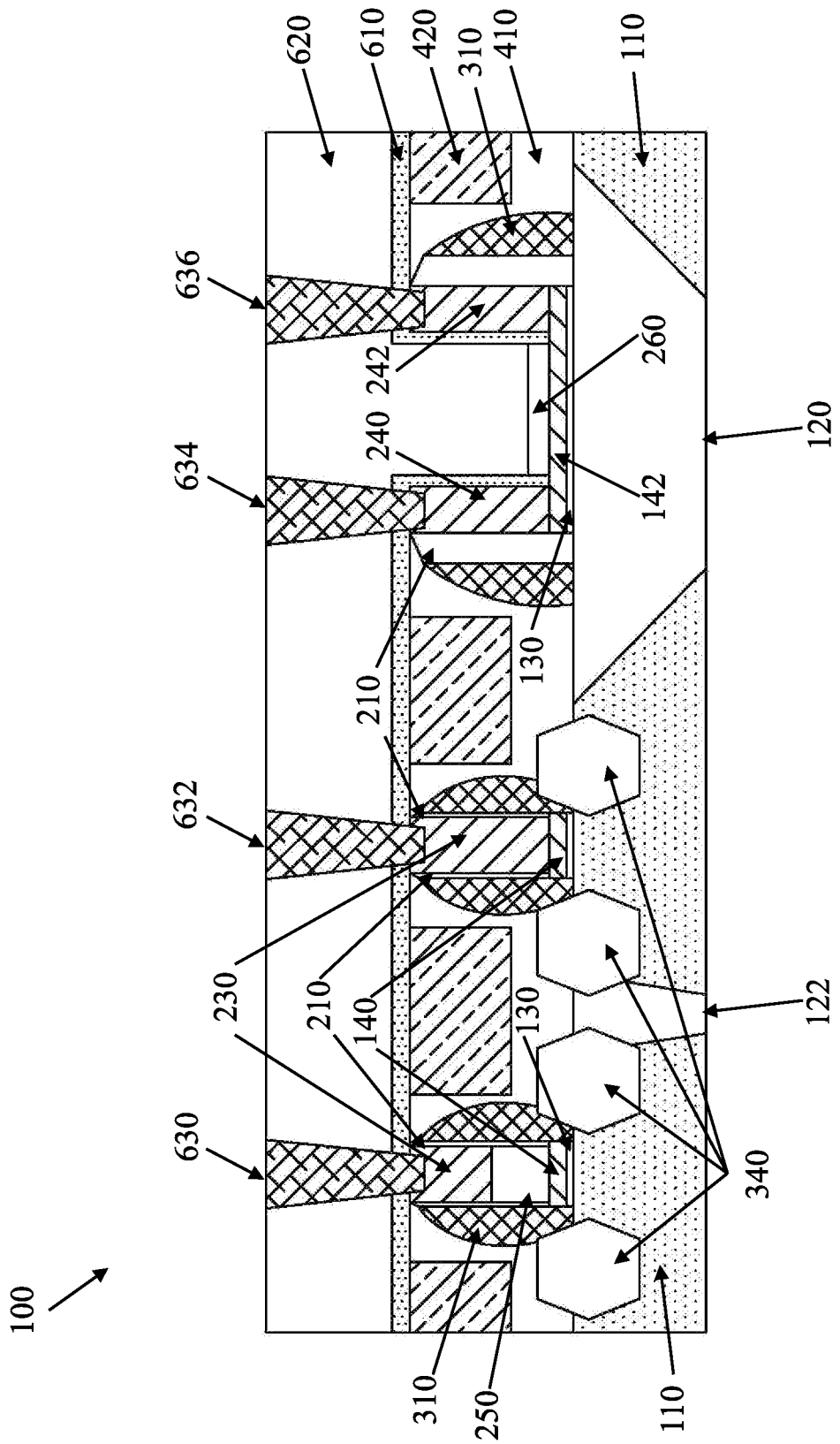
FIG. 8 illustrates in cross-sectional view a second illustrative embodiment of a semiconductor device structure.

In another embodiment, as shown in FIG. 8 a portion of the filler section 260 remains on a top surface of the resistor material 142. In this embodiment, the overall resistance of the resistor structure 290 is reduced by the remaining filler section 260 because filler section 260 and the resistor material 142 create two parallel resistors between the first resistor connector 240 and the second resistor connector 242. For example, in an embodiment the resistor material 142 comprises TiN with a thickness of approximately 2 nm and the filler section 260 comprising doped silicon with a thickness of approximately 30 nm. The two materials have an overall resistance of 300 Ohms/square between the first resistor connector 240 and the second resistor connector 242.

A representative embodiment relates to a method of forming a semiconductor structure, the method including forming a resistor over a substrate, depositing a filler material over the resistor and the substrate, and patterning the filler material to be over a middle area of the resistor. The method further includes forming connectors over the resistor, where the connectors are on laterally disposed sides of the filler material, and removing the filler material.

Another embodiment relates to a method of forming a semiconductor structure, the method including forming an isolation region in a substrate, forming a resistor over the isolation region, depositing a filler material over the substrate, isolation region, and the resistor, and performing a first patterning of the filler material, where the filler material covers the resistor. The method further includes depositing a dielectric layer over the filler material, the isolation region, and the substrate, performing a second patterning of the filler material, where the filler material covers a middle portion of the resistor, forming a first connector on the resistor, forming a second connector on the resistor, where the filler material is laterally disposed between the first connector and the second connector, and removing a portion of filler material.

Yet another embodiment relates to a semiconductor structure that includes an isolation region in a substrate, a resistor on the isolation region, a first connector on the resistor, and a second connector on the resistor. The semiconductor structure further includes a spacer on the resistor, where the spacer is laterally disposed between the first connector and the second connector.

Although present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or hereafter developed, that perform substantially the same function or achieve substantially the same result as corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor structure, the method comprising:
   forming a resistor over a substrate;
   depositing a filler material over the resistor and the substrate;
   patterning the filler material to be over a middle area of the resistor;
   forming a first connector and a second connector over the resistor, wherein the first connector and the second connector are on opposing sides of the filler material; and
   removing the filler material disposed between the first connector and the second connector, wherein the filler material is a different material layer than material forming the resistor.

2. The method of claim 1 further comprising:
   forming a dielectric layer over the resistor, the first connector, and the second connector; and
   forming contacts through the dielectric layer to the first connector and the second connector.

3. The method of claim 1 further comprising:
   forming a diffusion barrier layer over the substrate, wherein the forming the diffusion barrier layer is performed by a same process at a same time as the forming the resistor over the substrate.

4. The method of claim 3 further comprising:
   forming a first transistor gate over the diffusion barrier layer, wherein the forming the first transistor gate is performed by a same process and at a same time as the forming the first connector and the second connector over the resistor;
   depositing a second transistor gate over the diffusion barrier layer, wherein the depositing the second transistor gate is performed by a same process and at a same time as the depositing a filler over the resistor and the substrate; and
   patterning the second transistor gate, wherein the patterning the second transistor gate is performed by a same process and at a same time as the patterning the filler material.

5. The method of claim 1, wherein the forming the resistor over the substrate includes:
   forming an isolation region in the substrate; and
   forming the resistor over the isolation region.

6. The method of claim 1, wherein the forming the first connector and the second connector over the resistor includes:
   depositing a metal layer over the resistor and the filler material; and
   patterning the metal layer to be on the resistor and the sides of the filler material.

7. The method of claim 1, wherein the depositing the filler material over the resistor includes depositing a doped polysilicon over the resistor.

8. The method of claim 1, wherein the depositing the filler material over the resistor includes depositing a dielectric material over the resistor.

9. A method of forming a semiconductor structure, the method comprising:
   forming an isolation region in a substrate;
   forming a resistor over the isolation region;
   depositing a filler material over the substrate, isolation region, and the resistor;
   performing a first patterning of the filler material, wherein the filler material covers the resistor;
   depositing a dielectric layer over the filler material, the isolation region, and the substrate;
   performing a second patterning of the filler material, wherein the filler material covers a middle portion of the resistor;
   forming a first connector on the resistor;
   forming a second connector on the resistor; and
   removing a portion of filler material disposed between the first connector and the second connector, wherein the filler material is a different material layer than material forming the resistor.

10. The method of claim 9, wherein the removing the portion of filler material includes removing all of the filler material.

11. The method of claim 9 further comprising:
forming a diffusion barrier layer over the substrate and isolation region, wherein the forming the diffusion barrier layer is performed by a same process and at a same time as the forming the resistor over the isolation region.

12. The method of claim 11, wherein the method further comprises forming a first transistor gate over the diffusion barrier layer, wherein the forming the first transistor gate is performed by a same process and at a same time as the forming the first connector on the resistor and the forming the second connector on the resistor.

13. The method of claim 12 further comprising:
depositing a second transistor gate over the diffusion barrier layer, wherein the depositing the second transistor gate is performed at the same time as the depositing a filler material over the substrate, isolation region, and the resistor; and
patterning the second transistor gate, wherein the patterning the second transistor gate is performed by a same process and at a same time as the performing the first patterning of the filler material.

14. The method of claim 9, wherein the depositing the filler material includes depositing a doped polysilicon over the substrate, isolation region, and the resistor.

15. The method of claim 9, wherein the depositing the filler material includes depositing a dielectric material over the substrate, isolation region, and the resistor.

16. A method of forming a semiconductor structure, the method comprising:
forming an isolation region in a substrate;
forming a gate dielectric layer over the substrate and the isolation region;
forming a diffusion barrier layer over the gate dielectric layer;
forming a polysilicon layer over the diffusion barrier layer;
patterning the polysilicon layer, the diffusion barrier layer, and the gate dielectric layer to form a first gate structure over the substrate, a resistor structure over the isolation region, and a patterned diffusion barrier layer over the isolation region;
forming sidewall spacers on the first gate structure;
forming sidewall spacers on the resistor structure;
patterning the first gate structure and the resistor structure to remove portions of the polysilicon layer between the sidewall spacers on the first gate structure and the resistor structure;
forming a metal gate electrode in the first gate structure, and forming a first connector and a second connector to a resistor in the resistor structure, the first connector being interposed between a portion of the polysilicon layer and a first one of the sidewall spacers on sidewalls of the resistor structure, the second connector being interposed between the portion of the polysilicon layer and a second one of the sidewall spacers on sidewalls of the resistor structure, the patterned diffusion barrier layer forming the resistor in the resistor structure, the resistor comprising a current path between the first connector and the second connector;
patterning the portion of the polysilicon layer on the resistor to form an opening between the first connector and the second connector, wherein material of the polysilicon layer on the resistor is a different material layer than material forming the resistor; and
forming a dielectric layer over the first gate structure and the resistor structure and in the opening between the first connector and the second connector.

17. The method of claim 16 further comprising:
forming a first metal contact through the dielectric layer to the metal gate electrode of the first gate structure; and
forming a second metal contact and a third metal contact through the dielectric layer to the first connector and the second connector, respectively, of the resistor structure.

18. The method of claim 16, wherein the patterning the portion of the polysilicon layer on the resistor to form the opening between the first connector and the second connector includes removing all of the portion of the polysilicon layer on the resistor.

19. The method of claim 16, wherein the patterning the portion of the polysilicon layer on the resistor to form the opening between the first connector and the second connector includes leaving some of the portion of the polysilicon layer on the resistor.

20. The method of claim 16, wherein the resistor comprises titanium, titanium nitride, tantalum, tantalum nitride, or combinations thereof.

* * * * *